United States Patent
Diegmann (10) Patent No.: US 11,293,982 B2
(45) Date of Patent: Apr. 5, 2022

(54) TEST METHOD AND TEST SYSTEM

(71) Applicant: Rohde & Schwarz GmbH & Co. KG, Munich (DE)

(72) Inventor: Philip Diegmann, Munich (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 652 days.

(21) Appl. No.: 16/295,337

(22) Filed: Mar. 7, 2019

(65) Prior Publication Data

US 2020/0284839 A1 Sep. 10, 2020

(51) Int. Cl.
*G01R 31/3185* (2006.01)
*G01R 31/319* (2006.01)
*G01R 13/02* (2006.01)

(52) U.S. Cl.
CPC . *G01R 31/318519* (2013.01); *G01R 13/0236* (2013.01); *G01R 31/319* (2013.01); *G01R 31/31905* (2013.01); *G01R 31/31908* (2013.01); *G01R 31/31912* (2013.01); *G01R 31/318583* (2013.01)

(58) Field of Classification Search
CPC ........ G01R 31/318519; G01R 13/0236; G01R 31/318583; G01R 31/319; G01R 31/31905; G01R 31/31908; G01R 31/31912
USPC .......... 714/724, 725; 702/57, 58, 64, 65, 66, 702/71, 75, 76, 79, 80
See application file for complete search history.

(56) References Cited

U.S. PATENT DOCUMENTS

| | | | | |
|---|---|---|---|---|
| 5,914,902 A | * | 6/1999 | Lawrence | ........ G01R 31/31908 365/201 |
| 6,054,984 A | | 4/2000 | Alexander | |
| 7,024,617 B2 | * | 4/2006 | Sawaguchi | ...... G11B 20/10055 714/794 |
| 9,709,605 B2 | | 7/2017 | Alley et al. | |
| 2004/0062300 A1 | * | 4/2004 | McDonough | ........ H04B 1/7077 375/150 |
| 2006/0171463 A1 | * | 8/2006 | Hanamura | ............. H04N 19/40 375/240.13 |
| 2010/0194755 A1 | | 8/2010 | Foo et al. | |
| 2011/0119688 A1 | | 5/2011 | Prasanth et al. | |
| 2014/0163914 A1 | * | 6/2014 | Alley | .................... G01R 13/02 702/68 |
| 2016/0341766 A1 | | 11/2016 | Deverson et al. | |

(Continued)

FOREIGN PATENT DOCUMENTS

| | | |
|---|---|---|
| EP | 2743710 A1 | 6/2014 |
| EP | 3404427 A1 | 11/2018 |
| JP | H10319050 A | 12/1998 |

OTHER PUBLICATIONS

Extended European search report for European Patent Application No. 20159732.5 dated Jul. 16, 2020, 10 pages.

*Primary Examiner* — John J Tabone, Jr.
(74) *Attorney, Agent, or Firm* — Westman, Champlin & Koehler, P.A.

(57) ABSTRACT

The present invention provides an improved testing of a complex device under test, in particular a parallel analysis of signals of a device under test. Multiple signals of the device under test may be acquired and characteristic parameters of the acquired signals may be determined. The determined characteristic parameters of the multiple signals may be stored. In particular, the characteristic parameters may be stored in form of an array, table or spread sheet.

17 Claims, 2 Drawing Sheets

(56) References Cited

U.S. PATENT DOCUMENTS

2018/0335453 A1  11/2018  Diegmann
2020/0252246 A1* 8/2020  Tan ........................ G01R 27/32

* cited by examiner

TEST METHOD AND TEST SYSTEM

TECHNICAL FIELD

The present invention relates to a method for testing a device under test. The present invention further relates to a test system for testing a device under test. In particular, the present invention relates to testing a complex device under test.

BACKGROUND

Although applicable in principle to any electronic device, the present invention and its underlying problem will be hereinafter described in combination with testing a Field Programmable Gate array (FPGA).

Many modern integrated circuits like FPGAs and Application-Specific Integrated Circuits (ASICs) have to be provided with multiple different voltages. Depending on the application, a number of twenty or even more voltages have to be provided to such an integrated circuit. For a proper operation of these circuits, the individual voltages have to be provided in a well-defined sequence, which is known by the term "power-sequence". Furthermore, besides proper voltage levels and a correct sequence of applying the individual voltages, requirements such as slew rate, monotonicity etc. have to be guaranteed when providing the individual voltages.

In order to test the operation of such complex devices requiring multiple voltages with well-defined relationships, it is necessary to measure, record and analyze all these voltages together. However, due to the high number of voltage signals, the proper analysis of the individual signals and in particular the relationship between the individual signals is a challenging task. For example, when displaying all waveforms of the individual signals on a display of an oscilloscope or the like, it will be rather difficult for a user to recognize the properties of the individual signal waveforms and to determine whether or not the signal waveforms fulfill the desired requirements.

Against this background, a problem addressed by the present invention is to provide an improved and versatile testing of complex devices under test. In particular, the present invention aims to provide a testing of complex devices by analyzing a huge number of signals in parallel.

SUMMARY

The present invention solves this problem by a test method and a test system with the features of the independent claims. Further advantageous embodiments are subject-matter of the dependent claims.

According to a first aspect, test method for testing a device under test is provided. The test method comprising acquiring a sequence of at least two signals of the device under test; determining characteristic parameters for each signal in the acquired sequence; and storing the determined characteristic parameters in a measurement memory.

According to a further aspect, a test system for testing a device under test is provided. The test system comprises a processor and a measurement memory. The processor is configured to acquire a sequence of at least two signals of the device under test and determining characteristic parameters in each of the acquired at least two signals. The measurement memory is configured to store the determined characteristic parameters.

The present invention is based on the fact that testing of complex devices may require an analysis of a huge number of signal sequences in parallel. For example, a relationship between the individual signals has to be taken into account. For this purpose, characteristic properties of the number of signal sequences may be taken into account, and a proper timing of the characteristic parameters in the number of signal sequences has to be ensured when testing the multiple sequences of a complex device under test. However, a visual provision of a huge number of signal waveforms as provided by conventional test devices makes it difficult to reliably identify the correct properties of the individual signal waveforms and the timing of the signal change.

Thus, the present invention takes into account this finding and aims to provide an improved testing of a complex device under test by analyzing a huge number of signals in parallel. For this purpose, the present invention applies an acquisition of a sequence comprising multiple signals from the device under test and an automated determination of characteristic parameters in this sequence with respect to the signals. Furthermore, the determined characteristic parameters in the sequence are stored for a further analysis. In particular, the stored characteristic parameters of the sequence may be provided by the measurement memory in a form, which can be easily used for comparing the characteristic parameters with desired requirements of the complex device under test. In this way, the testing of complex devices under test is simplified and the reliability of the test results is improved.

The signals may be measured by probes for measuring the electric signals of the device under test. The probes may be any kind of appropriate probes. For example, the probes may comprise a measurement tip for measuring a voltage at a specific position, for example a pin of an integrated circuit. However, the probes may also comprise any kind of appropriate sensor, for example a current sensor for measuring an electric current. In particular, a separate probe may be provided for each signal to be measured. As already mentioned above, complex devices such as FPGAs or ASICs may require a huge number of signals, in particular voltages, which have to be applied in a well-defined manner. Accordingly, a separate probe may be used for measuring each of this huge number of signals. For example, each signal which is measured by one of the number of probes may be provided to a measurement device by a separate measurement cable.

For measuring analogue signals, an analogue-to-digital converter may be used. Accordingly, a separate analogue-to-digital converter may be used in each probe for converting an analogue measurement signal to digital measurement data. Alternatively, the analogue-to-digital conversion may be also performed by the measurement device. In this case, analogue signals may be measured by the probe and provided to the measurement device.

The measured signals measured by the multiple probes are provided to the measurement device for processing the measured signals. As already mentioned above, if the measured signals are provided as analogue signals, the analogue signals may be converted to digital data by an analogue-to-digital converter. For this purpose, a separate analogue-to-digital converter may be provided for each measured signal provided by one of the multiple probes. Accordingly, the number of analogue-to-digital converters may correspond to the number of probes for measuring the signals. Alternatively, if the measured signals are already converted to digital data by an analogue-to-digital converter included in the probe, the measurement device may comprise a digital interface for receiving the digital data of the respective probe.

The sequence of the signals may be acquired, for example, by an acquisition device. For example, a data sequence may be generated, wherein the data sequence comprises the digital measurement data relating to the measured signal. In particular, the recording of the signal sequence may be started upon a predetermined trigger event has been detected. For this purpose, the acquisition of a sequence for all measured signals may be triggered by a common trigger event. For example, the acquisition of the sequence may be started when detecting that the value of a specific measured signal exceeds a predetermined threshold value. However, it is understood, that any other appropriate trigger event may be also possible. For example, a rising or falling edge, a specific pulse or any other appropriate trigger event may be used for starting the acquisition of the sequence.

The acquired sequence of the multiple signal may be a sequence characterizing a temporal relationship between the individual signals. For example, in the acquired sequence, the multiple signals may be combined in a manner such that the sequence provides information about an order of the changes in the individual signals. In particular, is a sequence may combine together the individual signals such that the individual signals are acquired based on a common time basis. For example, the acquired sequence of the signals may provide information about the respective points in time when specific properties in the individual signals occur.

The acquired sequence of the measured signals may be further processed in order to determine characteristic parameters in the acquired sequence. For this purpose, the sequence may be processed to determine appropriate characteristic parameters.

Examples for characteristic parameters will be described in more detail below. For detecting characteristic parameters in the acquired sequence, the data of the sequence may be analyzed in order to detect predetermined patterns. For example, it may be possible to detect specific waveform element, specific values, specific changes in the values etc.

The identified characteristic parameters in the sequence may be characterized, for example, by identifying corresponding time-stamp information in the sequence and assigning an identifier or any other characteristic data to the corresponding time-stamp information of the respective signal. For example, a characteristic parameter may be specified by a number of the respective signal, the time-stamp when the respective characteristic parameter occurs and an identifier, for example a number or an alphanumeric specification for characterizing the identified characteristic parameter. However, it is understood, that any other appropriate scheme for specifying the characteristic parameters in the sequence may be also possible.

The acquisition of the sequence by the acquisition device and/or the determination of the characteristic parameters in the sequence may be performed, for example, by one or more processors executing predetermined instructions. For this purpose, a memory may be provided comprising instructions for instructing the one or more processors to carry out the desired operations. For example, the processor may carry out an operating system for reading the instructions from the memory and carrying out the respective operations. However, any other kind of acquisition for the sequence and determining characteristic parameters may be also possible.

After acquiring the sequence and processing the acquired sequences for detecting the characteristic parameters, the determined characteristic parameters may be stored in a measurement memory. For example, the information about the determined characteristic parameters in the sequence may be stored by specifying the respective signal, the time-stamp when the characteristic parameter has been determined and identifier for specifying the characteristic parameter as already described above. However, any other scheme may be also used for storing the determined characteristic parameters in the sequence. Furthermore, the related values of the signal may be also stored in association with the determined characteristic parameters. Alternatively, it may be also possible to store the complete measurement signals in the measurement memory, too.

The measurement memory may be, for example, a random access memory. In particular, the measurement memory may be a volatile memory. However, it may be also possible that the measurement memory may be a non-volatile memory, for example a flash memory or the like. It may be also possible to store the data of the determined characteristic parameters, the acquired sequence or any other information on a hard disk drive, a solid state drive or any other kind of storage device.

Further embodiments of the present invention are subject of further sub-claims and the following description referring to the drawings.

In a possible embodiment, the determining the characteristic parameters comprises determining a temporal relationship between the at least two signals in the acquired sequence.

In a possible embodiment, the method comprises displaying the characteristic parameters of the acquired sequence in form of an array, table or spreadsheet.

In possible embodiment, the characteristic parameter may comprise at least one of the following parameters. A minimum value, a maximum value, an average value, a phase shift, a rising or falling time, in particular a slew rate, a pulse width, a duty cycle, a periodic length, a frequency, a frequency spectrum, a shape of a waveform, a delay between signals or monotonicity properties. However, it is understood, that any other appropriate characteristic parameter may be also determined by the signal processor of the measurement device.

In a possible embodiment, the displaying the acquiring comprises acquiring a sequence of at least four, particularly eight, signals of the device under test.

In a possible embodiment, the method comprises displaying storing specifications of the device under test in a specification memory.

In a possible embodiment, the characteristic parameters comprise at least one of a minimum value, maximum value, average value, phase shift, rising or falling time, pulse width, duty cycle, periodic length, frequency, frequency spectrum, shape of a waveform, delay between signals or monotonicity properties.

In a possible embodiment, the method comprises associating the determined characteristic parameters of the acquired signal sequence with related specifications of the device under test.

In a possible embodiment, the method comprises displaying the characteristic parameters of the acquired sequence and the associated specifications of the device under test on a display.

In a possible embodiment, the method comprises comparing the characteristic parameters of the acquired sequence and corresponding specifications of the device under test.

In a possible embodiment, the method comprises displaying a result of the comparison between the characteristic parameters of the acquired sequence and corresponding specifications of the device under test.

In a possible embodiment, the result of the comparison is displayed in form of an array, table or spreadsheet.

In a possible embodiment, the method comprises generating a schematic representation of a waveform signal based on the characteristic parameters, the specifications of the device under test and/or the result of the comparison between the characteristic parameters of the acquired sequence and corresponding specifications of the device under test.

In a possible embodiment, the measurement memory is configured to store the determined characteristic parameters of the acquired signal sequences in form of an array, table or spread sheet.

By storing the characteristic parameters of the signal sequences in the above-mentioned form, the data, in particular the characteristic parameters of the signal sequences, can be stored and provided in a well-defined structured manner. For example, the characteristic parameters may be stored in a matrix comprising multiple rows and columns. Each row may relate to one of the determined characteristic parameters, and in the multiple columns, it may be possible to specify a point of time and a characterization of the determined characteristic parameter. Furthermore, the matrix may comprise multiple columns for each of the acquired signal sequences. In this way, it is further possible to identify correspondences between the multiple acquired signal sequences.

In a possible embodiment, the test system may comprise at least eight probes for measuring signals of the device under test. However, it may be also possible that the test system comprises at least twelve, sixteen, twenty or even more probes.

By a test system comprising a huge number of probes for measuring multiple electric signals in parallel, it is possible to measure and analyze the behavior of multiple signals for complex devices under test. In particular, it is possible to measure and analyze relationships between the individual signals. By measuring a huge number of signals in parallel, relationships between all of these acquired signals may be evaluated. Thus, it is possible to achieve an efficient, reliable testing of complex devices under test dealing with a huge number of signals.

In a possible embodiment, each of the number of probes is configured to measure a voltage signal. It may be also possible that at least some of the probes may be configured to measure a current signal. Furthermore, any other kind of signals may be also measured by some of the probes.

In a possible embodiment, the test system comprises an output device. The output device may be configured to output the stored characteristic parameters of the sequence. The characteristic parameters may be output, for example, in form of an array, table or spread sheet.

The characteristic parameters may be provided, for example, in electronic form by an appropriate interface. For example, the output device may comprise a communication interface, for example a network interface or a radio frequency interface for transmitting the characteristic parameters to a further device. The further device may receive the characteristic parameters, and, for example, may process the received characteristic parameters for further analysis. Furthermore, the output device may comprise an interface to an external memory device, for example a USB stick, a secure data (SD) card or the like. In this way, the data with the characteristic parameters of the acquired sequence may be copied to the external memory device. The external memory device may be removed and inserted to a further device, for example, for analyzing the stored data of the characteristic parameters. However, any further kind of output may be possible.

In a possible embodiment, the output device comprises a display. The display may be configured to display the stored characteristic parameters of the signal sequences. In particular, the characteristic parameters of the signal sequences may be displayed in form of an array, table or spread sheet.

In a possible embodiment, the test system comprises a specification memory. The specification memory may be configured to store specifications of the device under test. The processor may be configured to associate the determined characteristic parameters of the acquired sequences with related specifications of the device under test.

For example, the specification stored in the specification memory may comprise requirements, which have to be fulfilled by the acquired signals in order to realize a proper operation of the device under test. The specifications may be stored in any appropriate manner. Furthermore, it may be possible to store specifications of multiple possible devices under test. Each of the specifications may be associated with a specific device under test. For example, a device under test may be identified by a product ID or the like. When testing a device under test, the corresponding specifications for the respective device under test may be read out from the specification memory and used as references for comparing the acquired signal sequences with the desired requirements for the respective device under test. In this way, an evaluation of the measured and acquired signal sequences for a respective test may be performed in a very easy manner. In particular, the evaluation may be performed automatically.

In a possible embodiment, the stored specifications may comprise at least one of the following: a slew rate, in particular a rising slew rate and/or a falling slew rate, a shape of a signal waveform, monotonicity requirements, a delay between signal sequences, minimum and/or maximum values, in particular minimum and/or maximum voltages. However, it is understood, that any other requirement may be also specified by the stored specifications.

In a possible embodiment, the processor of the test system is configured to determine, whether or not the characteristic parameters of the acquired sequence are within the related specifications of the device under test.

For this purpose, the processor may associate the determined characteristic parameters with corresponding specifications, and compare the determined characteristic parameters with the desired values for the respective specifications. In this way, an automated analysis of the acquired sequence can be achieved. As the test system deals with a huge number of signal sequences, in particular at least four, eight or even more signal sequences in parallel, the automated determination of characteristic parameters and the association of the determined characteristic parameters with corresponding requirements for the device under test may provide a huge improvement for analyzing the acquired measurements.

For example, test system may identify correspondences between the determined characteristic parameters and the corresponding specifications and evaluate whether or not the identified characteristic parameters are within the requirements according to the specifications. The result of this analysis may be stored and/or output, for example on a display. For example, a table or the like may be displayed on a display of the measurement result, wherein deviations of the identified characteristic parameters from the requirements are marked. For example, different colors may be used for characteristic parameters, which fulfill the required specifications and for characteristic parameters, which are not in line with the required specifications. Furthermore, a bar graph or a continuously changing color may be used in order to specify a degree of deviation between the determined characteristic parameter and the corresponding requirements. However, it is understood, that any other scheme for analyzing the requirements of the device under test and for providing the results of the automated analysis may be also possible.

In a possible embodiment, the measurement device may comprise an oscilloscope.

For example, the acquired measurements by the multiple probes may be provided to an oscilloscope, and the oscilloscope may perform the acquisition of the sequence and the analysis of the acquired sequence in order to determine the desired characteristic parameters. Furthermore, the oscilloscope may be configured to provide the results for the multiple sequence as already described above. However, it is understood that any other appropriate device for acquiring the signal sequences and identifier and characteristic parameters in multiple signals of the sequence may be also possible.

With the present invention it is therefore now possible to perform an improved and efficient testing of complex devices under test, in particular complex devices under test dealing with a huge number of signals. For example, it may be possible to analyze a huge number of signals provided to a device under test and/or devices under test outputting a huge number of signals. Especially, it is even possible to analyze input and output signals of a complex device under test in parallel. By analyzing characteristic parameters in the multiple acquired signals, it is possible to reduce an amount of information provided to a user. In this way, the user can evaluate the measurement results more easily. Furthermore, the determination of characteristic parameters for the multiple acquired signal sequences may be also used for an automated analysis of the measurement results. In this way, an efficient, fast and reliable testing of complex devices dealing with a huge number of signals in parallel can be achieved.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
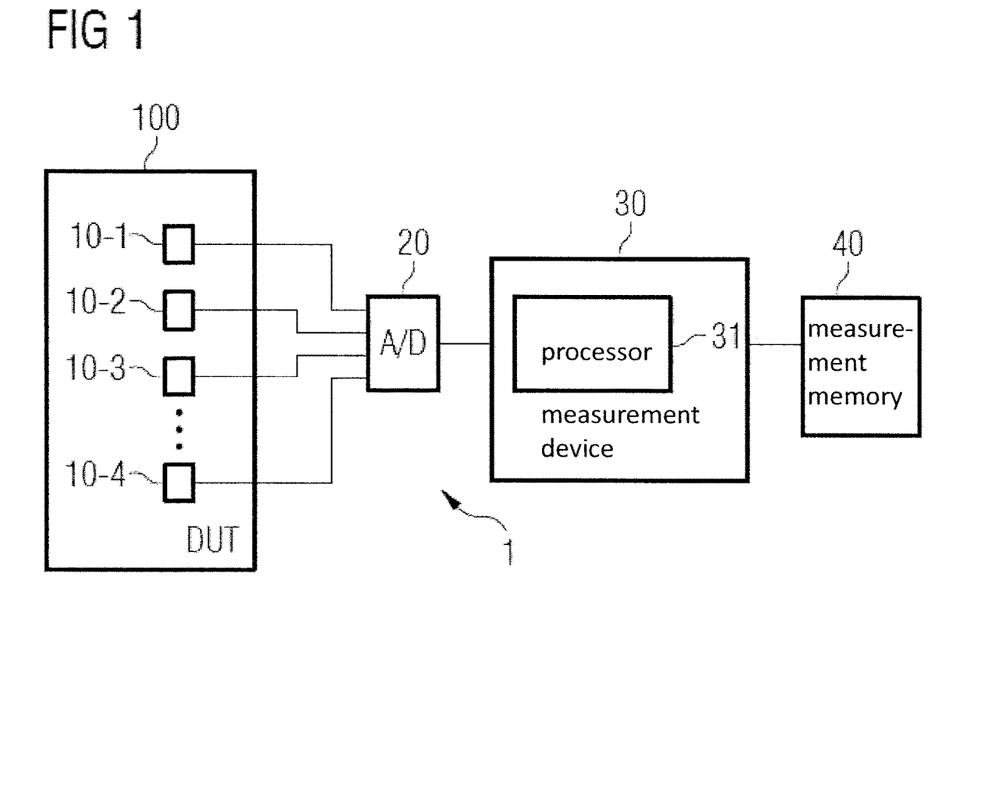
FIG. 1 shows a block diagram of an embodiment of a test system according to the present invention.

FIG. 1 shows a test arrangement with a test system 1 for testing a device under test 100. The test system 1 may comprise a number of probes 10-$i$, a measurement device 30 with a processor 31, and a measurement memory 40. The device under test may be, for example a FPGA, an ASIC, or any other kind of complex device such as a processor, a processing system or the like dealing with multiple signals. For example, the device under test might be provided with multiple supply voltages. The multiple supply voltages may have different voltage levels. Further, the multiple voltages have to be provided in a well-defined specific order. Furthermore, additional requirements regarding voltage level, waveform of the signals and monotonicity of the signals have to be fulfilled for a proper operation of the device under test. Furthermore, it may be also possible to test multiple output signals provided by the device under test 100. It is understood that also a combination of input signals, supply voltages and output signals of the device under test 100 might be tested by the test system 1.

For testing the multiple signals of the device under test 100, in particular for testing the multiple signals in parallel, an appropriate number of probes 10-$i$ is provided. Each probe 10-$i$ may measure a specific signal of the device under test 100. For example, the probes 10-$i$ may have a connection tip for electrically connecting the probe 10-1 with a specific measurement point of the device under test 100. Accordingly, a voltage may be measured by a probe 10-$i$. Furthermore, the probes 10-$i$ may be also probes for measuring an electric current or any other feature of the device under test 100. Accordingly, the probe tips may have appropriate connectors or sensors for measuring the desired properties of the device under test 100.

Since the test system 100 aims to analyze multiple signals of the device under test 100 in parallel, an appropriate number of probes 10-$i$ may be provided for measuring the desired number of signals. Thus, at least two probes 10-$i$, preferably at least four or eight probes or even more, for example twelve, sixteen, twenty or any other appropriate number of probes 10-$i$ may be provided by the test system 100. For example, the test system 1 may comprise multiple identical probes 10-$i$ for measuring specific properties, for example voltages. However, it may be also possible that at least some of the probes 10-$i$ may be different. For example, a first number of probes 10-$i$ may be provided for measuring a voltage and a second number of probes 10-$i$ may be provided for measuring a current.

In case that the measurement probes 10-$i$ measure an analogue signal, the measured analogue signal may be converted to digital data by an analogue-to-digital converter. For example, the analogue measurement signals measured by the probes 10-$i$ may be provided to an analogue-to-digital converting device 20. Analogue-to-digital converting device 20 may comprise a separate analogue-to-digital converter for each analogue measurement signal provided by one of the probes 10-$i$. Accordingly, analogue-to-digital converter 20 may convert the analogue measurement signals to digital data having a predetermined sampling rate and/or resolution. The properties for the analogue-to-digital conversion, in particular the sampling rate and/or the resolution may be fixed. Alternatively, the properties such as sampling rate and/or resolution may be set, for example, by measurement device 30. As already mentioned above, the analogue-to-digital conversion may be performed either by a separate analogue-to-digital converting device 20, by analogue-to-digital converters included in the probes 10-$i$ or analogue-to-digital converters included in the measurement device 30.

Accordingly, the signals measured by the number of probes 10-$i$ are provided to the measurement device 30 in analogue form and converted to digital data by an analogue-to-digital converter included in a measurement device 30, or alternatively, the measured signals are converted to digital data outside the measurement device 30 and provided to the measurement device 30 in digital form. Processor 31 of the measurement device 30 receives the digital data corresponding to the multiple measured signals measured by the number of probes 10-$i$, and acquires a sequence with each of the measured electric signals measured by the number of probes 10-$i$. For example, processor 31 may generate a sequence comprising the multiple signals provided by the probes 10-$i$. The acquired sequence may be built by the signals provided by the number of probes 10-$i$. In particular, the sequence may be acquired by considering the temporal relationship, e.g. an order of events in the individual signals. Accordingly, the acquired sequence may serve as a basis for analyzing the temporal relationship or an order of the events in the individual signal. Such events may be, for example, a rising or falling edge, exceeding or decreasing a predetermined threshold value, a specific waveform element, etc.

The acquisition of the signal sequences by processor 31 may be started upon detecting a predetermined trigger event. For example, the trigger event may comprise a detection of a rising and/or falling edge in one of the measured signals, a detection of a signal level exceeding or falling below a predetermined threshold level or any other characteristic event in one of the measured signals. It is understood, that the data acquisition may be also triggered by specifying multiple trigger events. The multiple trigger events may relate to one or some of the measured signals. Furthermore, all measured signals may be monitored in order to detect specific trigger events in the measured signals. It may be even possible to specify a combined trigger event by a combination of a sequence of individual trigger events, in particular a sequence of trigger events, which have to be fulfilled in a predetermined order to start the acquisition of the signal sequences by processor 31. Furthermore, it may be also possible to start the acquisition of the sequence based on an external signal.

The acquired sequence may comprise measurement data of all related signals. For example, the acquired sequence may be a sequence comprising measurement data from all probes 10-$i$, wherein the individual measurement data elements are arranged in a correct temporal order. In a possible embodiment, the acquired sequence may be built by an array or matrix, wherein one dimension is used for the temporal resolution, and a further dimension is used for arranging the multiple signals. For example, an array may be formed by a separate column for each signal, and each of the whole of the array may comprise measurement data relating to a specific point in time. However, it is understood, that any other scheme for acquiring the sequence of the multiple signals may be also possible.

Processor 31 may analyze the acquired sequence. In particular, processor 31 may process the sequence in order to determine characteristic parameters of the acquired sequence. For example, the processor 31 may identify a minimum value, for example a minimum voltage, a maximum value, an average or mean value or any other kind of statistical parameter related to a signal of the sequence. Furthermore, the sequence may be analyzed to identify rising or falling edges, to determine a slew rate, in particular a rising and/or falling slew rate, a pulse width, a duty cycle or the like. Furthermore, periodic signals may be analyzed to determine a periodic length, a frequency or a frequency spectrum. Processor 31 may also be configured to analyze a waveform of the signals in the acquired sequence, for example to determine a shape of a waveform or the like. Processor 31 may also analyze any kind of relationship between the individual signals in the sequence. For example, a phase shift or delay between signals may be analyzed. Processor 31 may also analyze, for example, monotonicity properties of the acquired signal sequences. For example, processor 31 may detect discontinuities in the signals of the sequence. However, any other kind of property or characteristic may be also detected by a processor 31. When determining the characteristic parameter in the signal sequence, processor 31 may assign a corresponding time-stamp information to the respective properties of the signal in the sequence. The acquisition of the sequence and/or the analysis of the sequence for determining characteristic parameter may be performed, for example, by an oscilloscope or the like.

After determining the characteristic parameter of the acquired sequence, the determined characteristic parameters are stored in measurement memory 40. Measurement memory 40 may be, for example, a volatile memory of the measurement device 30. However, it may be also possible that measurement memory 40 is a non-volatile memory, for example, a flash memory, a secure data card or an USB stick. Any other kind of memory for storing the data of the characteristic parameter determined by processor 31 may be also possible.

The characteristic parameters of the sequence, which are determined by processor 31 may be stored, for example, in form of an array, a table or a spread sheet. However, any other format, in particular any other structured form for storing the characteristic parameters may be also possible. For example, an array or matrix may be created with one dimension for the number of signal sequences and a further dimension for the characteristic parameters or the time. The characteristic parameters may be specified in any appropriate form. For example, a specific identifier, for example a number or an alphanumeric sequence may be used for characterizing each characteristic parameter, which can be determined by the processor 31.

In a possible example, the determined characteristic parameters may be stored in a format comprising an identifier for the respective signal in the acquired sequence, an identifier for the determined characteristic parameter and at least one further element for specifying the values related with the respective characteristic parameter. For example, a minimum, maximum or average value may be specified by a specific point of time when the value is determined and an additional field comprising the determined value. A rising or falling slew may be characterized by a first time information specifying the beginning of the slew, a second time information specifying the ending of the slew and a valued characterizing the difference between the beginning and the ending of the slew. Alternatively, the value of the signal at the beginning of the slew and the value of the signal at the ending of the slew may be specified. A monotonicity of a signal may be specified by identifying one or more points in time when discontinuity of the signal is detected. It is understood, that the before-mentioned examples are only some examples for explaining the invention without limiting the scope of the invention. Any other kind of characteristic parameters and any kind of data format for specifying the detection of the characteristic parameters may be possible. In particular, any kind of scheme for storing the determined characteristic parameters in a structured form such as a matrix, array, table or spread sheet may be possible.

Figure 2:
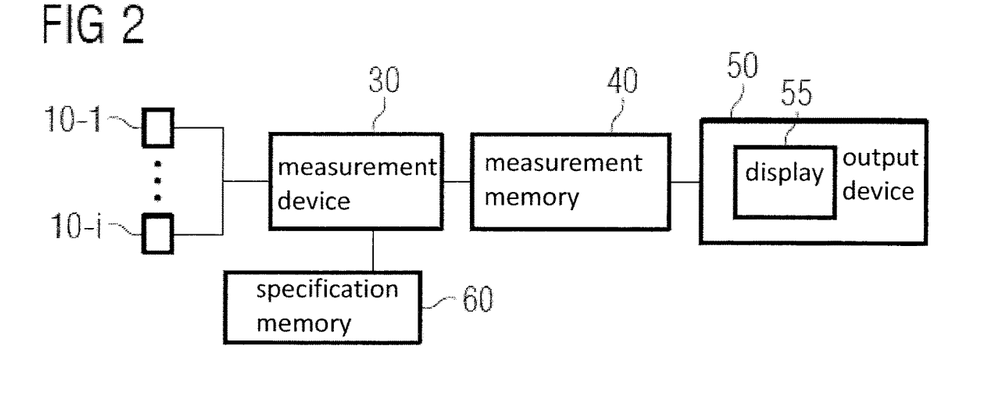
FIG. 2 shows a block diagram of another embodiment of a test system according to the present invention.

FIG. 2 shows a block diagram of a further embodiment of a test system 1. The test system 1 according to FIG. 2 mainly corresponds to the previously described test system 1. Thus, the description in connection with FIG. 1 also applies to the embodiment according to FIG. 2.

As can be seen in FIG. 2, the test system 1 may further comprise an output device 50. Output device 50 may be configured to output the data stored in measurement memory 40. The data may be output in any appropriate form. For example, the data may be output by a wired or wireless interface for transmitting the data to a remote side. Additionally or alternatively, it may be possible to output the stored data relating to the characteristic parameters of the signal sequences locally. For example, output device 50 may comprise a display 55. For example, display 55 may be a monochrome or colored display. Accordingly, the information regarding to the characteristic parameters stored in measurement memory 40 may be displayed on display 55. The data may be displayed in form of an array, a table or a spread sheet. However, any other appropriate form for displaying the data relating to the characteristic parameters may be also possible. Since test system 1 acquires a sequence with a huge number of signals, providing the acquired signals of the sequences in form of individual waveforms for each signal may result in a huge number of waveforms. Thus, the individual waveforms have to be displayed with a relative small size. This makes it difficult for a user to analyze the individual waveforms. Alternatively, if the individual waveforms are overlaid, it may be also rather difficult to differentiate between the individual waveforms even if the waveforms would be displayed in different colors. Hence, displaying the signals by waveforms would make it rather impossible to identify small details in the displayed waveforms. To overcome this drawback, the test system 1 in this embodiment may display the data relating to the characteristic parameters of the sequence by providing the respective information in alphanumeric form, at least in part.

For example, output device 50 may output the data stored in measurement memory 40 in text form or by a combination of symbols and alphanumeric digits.

Test system 1 may further comprise a specification memory 60. Specification memory 60 may store specifications of the device under test 100. For example, specification memory 60 may store requirements with respect to the measured signals. The specifications may comprise, for example, specifications with respect to a minimum voltage, a maximum voltage, disturbances such as noise on a signal, specifications with respect to a slew rate, in particular a rising and/or falling slew rate, requirements with respect to a delay between individual signals, requirements with respect to a phase shift between individual signals, specifications regarding the waveform of the signals or the monotonicity of the signals. However, any other kind of a specification may be also provided. For example, the specification may be input by a user before starting the test of the device under test 100. Alternatively, the specifications may be stored in the specification memory by a wired or wireless communication between the specification memory or the measurement device 30 and a remote device. It may be also possible that specifications with respect to multiple possible devices under test may be stored in specification memory 60. In this case, a user may select one group of specifications, which shall be used when testing device under test 100. Furthermore, it may be possible to automatically identify the device under test 100 and select an appropriate set of specifications, which is stored in the specification memory 60.

Measurement device 30, in particular processor 31 may read the appropriate specifications from specification memory 60 and compare the signals, in particular the determined characteristic parameters of the sequence with the related specifications for the device under test 100. For this purpose, processor 31 may associated a detected characteristic property of a signal in the sequence with a corresponding specification. After matching a characteristic parameter of a signal n the sequence with a related specification, it may be determined whether or not the properties of the detected characteristic parameter in the sequence fulfills the required specifications. In this way, an automated evaluation of the acquired sequence may be performed.

Since the test system 1 deals with a huge number of signals corresponding to the huge number of electric signals measured by probes 10-$i$, the automated identification of characteristic parameters in the acquired sequence and in particular the analysis of the characteristic parameters with respect to the specifications for the device under test makes it possible to simplify the test of the device under test and to improve the reliability of the test result. In particular, the automated evaluation of the multiple test signals based on the characteristic parameters makes it possible to achieve an error-free analysis of the measurements. In contrast to this, such a high amount of signals and related data cannot be evaluated manually by a user. Even if all the measurement results would be provided by simply displaying corresponding waveforms, it is almost impossible to perform manual analysis of the displayed waveforms.

After analyzing the characteristic parameters of the multiple signals in the sequence, and evaluating the characteristic parameters with respect to the specifications of the device under test, the test results may be stored in measurement memory 40 and/or output by output device 50. In particular, the test result may be displayed on display 55. For example, the characteristic parameters may be displayed in a first form, for example by a first color, if the determined characteristic parameters fulfill the related specifications. If the characteristic parameters do not fulfill the specifications, the respective characteristic parameters may be output in another form, for example by another color. However, any other scheme for outputting the measurement results, in particular the characteristic parameters may be also possible.

Figure 3:
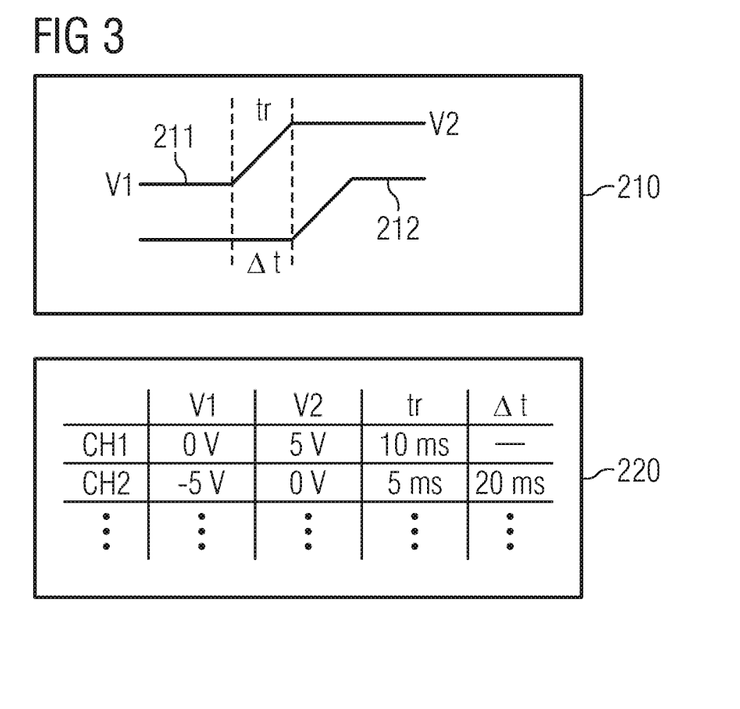
FIG. 3 shows a schematic illustration of a display output provided by a test system according to an embodiment.

FIG. 3 shows a schematic example for outputting test results related to characteristic parameters. For example, in a first part 210 of a display, a schematic representation of waveforms may be displayed for illustrating the respective characteristic parameter. In the example according to FIG. 3, the characteristic parameter may relate to a delay or rising edges. For example, a first waveform 211 may illustrate a first rising edge, and a second waveform 212 may illustrate a second rising edge. This representation may be used for explaining the related parameters to a user. In a second part 220 of the display, the data relating to the characteristic parameters for the multiple signals of the acquired sequence may be displayed. This data may be provided, for example in form of a table or the like. For example, for each signal of the sequence, the related parameters may be output in the respective fields of the table. Each row of the table may relate to a specific channel, and each column of the table may relate to a specific value of the characteristic parameter. In this way, the voltage level before the rising edge and after the rising edge may be displayed. Furthermore, the timing of the rising edge may be also displayed by the respective values.

However, it is understood, that the example according to FIG. 3 is only a simple example for understanding the present invention. Any other kind of representation for displaying the characteristic parameters of the sequence in appropriate form may be possible. For example, the information may be provided by a simple table without an additional schematic waveform. Alternatively, it may be also possible to display a schematic waveform and to overlay the respective parameters at appropriate positions of the schematic waveform. Any other scheme for displaying the characteristic parameters may be also possible.

Figure 4:
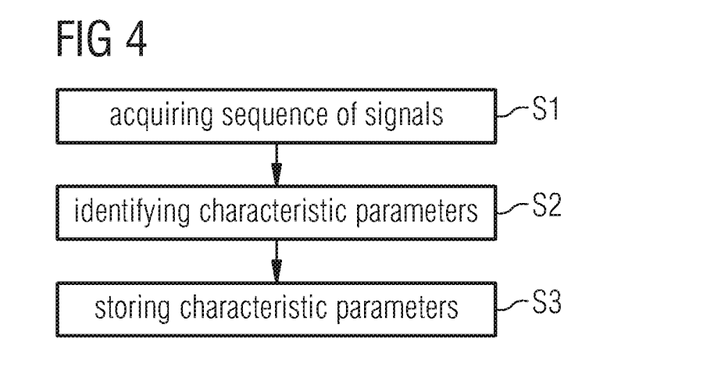
FIG. 4 shows a block diagram of an embodiment of a test method according to an embodiment.

FIG. 4 shows a schematic flow diagram of a test method for testing a device under test according an embodiment.

In step S1 a sequence of at least two signals of the device under test 100 is acquired. In step S2 characteristic parameters for each signal in the acquired sequence are determined. In step S3 the determined characteristic parameters are stored in a measurement memory 40.

The step S2 of determining the characteristic parameters may comprise determining a temporal relationship between the at least two signals in the acquired sequence.

The method may further comprise a step of displaying the characteristic parameters of the acquired sequence in form of an array, table or spreadsheet.

The step S1 of acquiring the sequence may comprise acquiring a sequence of at least four, particularly eight, signals of the device under test.

The method may further comprise a step of storing specifications of the device under test in a specification memory.

The characteristic parameters may comprise at least one of a minimum value, maximum value, average value, phase shift, rising or falling time, pulse width, duty cycle, periodic length, frequency, frequency spectrum, shape of a waveform, delay between signals or monotonicity properties.

The method may further comprise a step of associating the determined characteristic parameters of the acquired signal sequence with related specifications of the device under test.

The method may further comprise a step of displaying the characteristic parameters of the acquired sequence and the associated specifications of the device under test on a display.

The method may further comprise a step of comparing the characteristic parameters of the acquired sequence and corresponding specifications of the device under test.

The method may further comprise a step of displaying a result of the comparison between the characteristic parameters of the acquired sequence and corresponding specifications of the device under test.

The result of the comparison may be displayed in form of an array, table or spreadsheet.

The method may further comprise a step of generating a schematic representation of a waveform signal based on the characteristic parameters, the specifications of the device under test and/or the result of the comparison between the characteristic parameters of the acquired sequence and corresponding specifications of the device under test.

Summarizing, the present invention relates to an improved testing of a complex device under test, in particular a parallel analysis of signals of a device under test. A sequence of at least two signals of the device under test is acquired and characteristic parameters for each signal in the acquired sequence are determining. The determined characteristic parameters are stored in a measurement memory for further analysis or for displaying the parameters.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon re-viewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not in-tended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A test method for testing a device under test, the test method comprising:
acquiring a sequence of at least two signals of the device under test;
determining characteristic parameters for each signal in the acquired sequence; and
storing the determined characteristic parameters in a measurement memory;
wherein determining characteristic parameters in the acquired sequence comprises detecting predetermined patterns; and
wherein the characteristic parameters of the sequence are stored in form of an array, a table or a spread sheet with one dimension for the number of signal sequences and a further dimension for the characteristic parameters.

2. The method of claim 1, wherein determining the characteristic parameters comprises determining a temporal relationship between the at least two signals in the acquired sequence.

3. The method of claim 1, wherein the acquiring comprises acquiring a sequence of at least four signals of the device under test.

4. The method of claim 1, comprising storing specifications of the device under test in a specification memory.

5. The method of claim 4, wherein the characteristic parameters comprise at least one of a minimum value, maximum value, average value, phase shift, rising or falling time, pulse width, duty cycle, periodic length, frequency, frequency spectrum, shape of a waveform, delay between signals or monotonicity properties.

6. The method of claim 4, comprising associating the determined characteristic parameters of the acquired signal sequence with related specifications of the device under test.

7. The method of claim 4, comprising comparing the characteristic parameters of the acquired sequence and corresponding specifications of the device under test.

8. The method of claim 7, comprising displaying a result of the comparison between the characteristic parameters of the acquired sequence and corresponding specifications of the device under test.

9. The method of claim 7, comprising generating a schematic representation of a waveform signal based on the characteristic parameters, the specifications of the device under test and/or the result of the comparison between the characteristic parameters of the acquired sequence and corresponding specifications of the device under test.

10. A test system for testing a device under test, the test system comprising:
a processor for acquiring a sequence of at least two signals of the device under test and determining characteristic parameters in each of the acquired at least two signals, wherein determining characteristic parameters in the acquired sequence comprises detecting predetermined patterns; and
a measurement memory for storing the determined characteristic parameters, wherein the characteristic parameters of the sequence are stored in the form of an array, a table or a spread sheet with one dimension for the number of signal sequences and a further dimension for the characteristic parameters.

11. The test system of claim 10, comprising a display for displaying the characteristic parameters of the acquired sequence in form of an array, table or spreadsheet.

12. The test system of claim 10, comprising a specification memory for storing specifications of the device under test in a specification memory.

13. The test system of claim 12, wherein the characteristic parameters comprise at least one of a minimum value, maximum value, average value, phase shift, rising or falling time, pulse width, duty cycle, periodic length, frequency, frequency spectrum, shape of a waveform, delay between signals or monotonicity properties.

14. The test system of claim 12, wherein the processor is configured to associate the determined characteristic parameters of the acquired signal sequence with related specifications of the device under test.

15. The test system of claim 12, wherein the processor is configured to compare the characteristic parameters of the acquired sequence and corresponding specifications of the device under test.

16. The test system of claim 15, comprising generating a schematic representation of a waveform signal based on the characteristic parameters, the specifications of the device under test and/or the result of the comparison between the characteristic parameters of the acquired sequence and corresponding specifications of the device under test.

17. The test system of claim 12, comprising a display for displaying the characteristic parameters of the acquired sequence and the associated specifications of the device under test.

* * * * *